United States Patent
Chiu et al.

(10) Patent No.: US 12,550,386 B2
(45) Date of Patent: Feb. 10, 2026

(54) N-TYPE METAL OXIDE SEMICONDUCTOR TRANSISTOR AND METHOD FOR FABRICATING THE SAME

(71) Applicant: UNITED MICROELECTRONICS CORP., Hsin-Chu (TW)

(72) Inventors: Chun-Ya Chiu, Tainan (TW); Ssu-I Fu, Kaohsiung (TW); Chin-Hung Chen, Tainan (TW); Jin-Yan Chiou, Tainan (TW); Wei-Chuan Tsai, Changhua County (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 578 days.

(21) Appl. No.: 17/960,146

(22) Filed: Oct. 5, 2022

(65) Prior Publication Data

US 2024/0088293 A1    Mar. 14, 2024

(30) Foreign Application Priority Data

Sep. 8, 2022  (CN) .......................... 202211093824.9

(51) Int. Cl.
| | |
|---|---|
| *H10D 30/69* | (2025.01) |
| *H01L 21/265* | (2006.01) |
| *H01L 21/324* | (2006.01) |
| *H10D 30/01* | (2025.01) |

(52) U.S. Cl.
CPC ..... *H10D 30/796* (2025.01); *H01L 21/26506* (2013.01); *H01L 21/324* (2013.01); *H10D 30/0212* (2025.01)

(58) Field of Classification Search
CPC .. H10D 30/796; H10D 30/0212; H10D 62/53; H10D 30/60; H10D 64/251; H10D 30/0227; H10D 30/601; H10D 84/85; H10D 30/792
See application file for complete search history.

(56) References Cited

U.S. PATENT DOCUMENTS

| | | |
|---|---|---|
| 6,326,289 B1 | 12/2001 | Rodder |
| 7,625,801 B2 | 12/2009 | Wu |
| 7,759,208 B1 * | 7/2010 | Frye .................. H01L 21/28518 |
| | | 257/E21.337 |

(Continued)

FOREIGN PATENT DOCUMENTS

| | | |
|---|---|---|
| JP | 2011-119472 | 6/2011 |
| KR | 10-2006-0126972 A | 12/2006 |

(Continued)

*Primary Examiner* — Syed I Gheyas
(74) *Attorney, Agent, or Firm* — Winston Hsu (57) ABSTRACT

An n-type metal oxide semiconductor transistor includes a gate structure, two source/drain regions, two amorphous portions and a silicide. The gate structure is disposed on a substrate. The two source/drain regions are disposed in the substrate and respectively located at two sides of the gate structure, wherein at least one of the source/drain regions is formed with a dislocation. The two amorphous portions are respectively disposed in the two source/drain regions. The silicide is disposed on the two source/drain regions, wherein at least one portion of the silicide overlaps the two amorphous portions.

8 Claims, 10 Drawing Sheets

(56) References Cited

U.S. PATENT DOCUMENTS

| | | | | |
|---|---|---|---|---|
| 2009/0321841 | A1* | 12/2009 | Hoentschel | H10D 84/017 |
| | | | | 257/E21.639 |
| 2015/0255602 | A1* | 9/2015 | JangJian | H10D 30/60 |
| | | | | 438/285 |
| 2016/0204229 | A1* | 7/2016 | Tsai | H10D 30/796 |
| | | | | 438/283 |
| 2016/0211362 | A1* | 7/2016 | Lu | H10D 30/797 |
| 2017/0179253 | A1 | 6/2017 | Cha | |

FOREIGN PATENT DOCUMENTS

| | | |
|---|---|---|
| KR | 10-2011-0038652 | 4/2011 |
| KR | 10-2015-0110284 | 10/2015 |
| KR | 10-2016-0018317 A | 2/2016 |
| KR | 10-2017-0074344 | 6/2017 |
| KR | 10-2018-0079255 | 7/2018 |
| KR | 10-2021-0141290 | 11/2021 |

\* cited by examiner

N-TYPE METAL OXIDE SEMICONDUCTOR TRANSISTOR AND METHOD FOR FABRICATING THE SAME

BACKGROUND OF THE INVENTION

1. Field of the Invention

The present disclosure relates to the field of semiconductor devices, and more particularly, to an n-type metal oxide semiconductor (NMOS) transistor and method for fabricating the same.

2. Description of the Prior Art

A conventional metal oxide semiconductor transistor is usually formed on a substrate and includes two source/drain regions, a channel region located between the two source/drain regions, a gate structure located above the channel region and a spacer surrounds a sidewall of the gate structure. The gate structure may include a gate dielectric layer disposed on the channel region and a gate material layer disposed on the gate dielectric layer.

Since the lattice arrangement of the channel region will affect the rate of carriers passing therethrough, in order to improve the carrier mobility, one of the existing approaches for NMOS transistors is to perform the stress memorization technique (SMT) process, in which a stress layer may be formed on the substrate to cover the NMOS transistor, and then a thermal process, such as a rapid thermal process (RTP), may be performed, whereby the lattice arrangement of the channel region can be changed by the stress provided by the stress layer, so as to form a strained channel region with tensile stress. However, in the process of changing the lattice arrangement, dislocations are formed in the source/drain regions. When performing the subsequent self-aligned silicide process, the silicide tends to flow along the dislocation and is formed at a position which is not predetermined. As a result, the properties of the NMOS transistor are not satisfied, such as high resistance (RS), lower yield, etc.

Therefore, the structure of the conventional NMOS transistor and fabricating method thereof still need to be improved, so as to improve the property and yield of the NMOS transistor.

SUMMARY OF THE INVENTION

According to one aspect of the present disclosure, an NMOS transistor includes a gate structure, two source/drain regions, two amorphous portions and a silicide. The gate structure is disposed on a substrate. The two source/drain regions are disposed in the substrate and respectively located at two sides of the gate structure, wherein at least one of the source/drain regions is formed with a dislocation. The two amorphous portions are respectively disposed in the two source/drain regions. The silicide is disposed on the two source/drain regions, wherein at least one portion of the silicide overlaps the two amorphous portions.

According to another aspect of the present disclosure, a method for fabricating an NMOS transistor includes steps as follows. A gate structure is formed on a substrate. Two source/drain regions are formed in the substrate and respectively located at two sides of the gate structure. A first pre-amorphous implantation (PAI) process is performed to implant a first amorphizing substance into the two source/drain regions. A SMT process is performed to form a strained channel, wherein the strained channel is located in the substrate and below the gate structure, and at least one of the source/drain regions is formed with a dislocation. A second PAI process is performed to implant a second amorphizing substance into the two source/drain regions, so as to form two amorphous portions respectively in the two source/drain regions. A self-aligned silicide process is performed to form a silicide on the two source/drain regions.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

Figure 1:
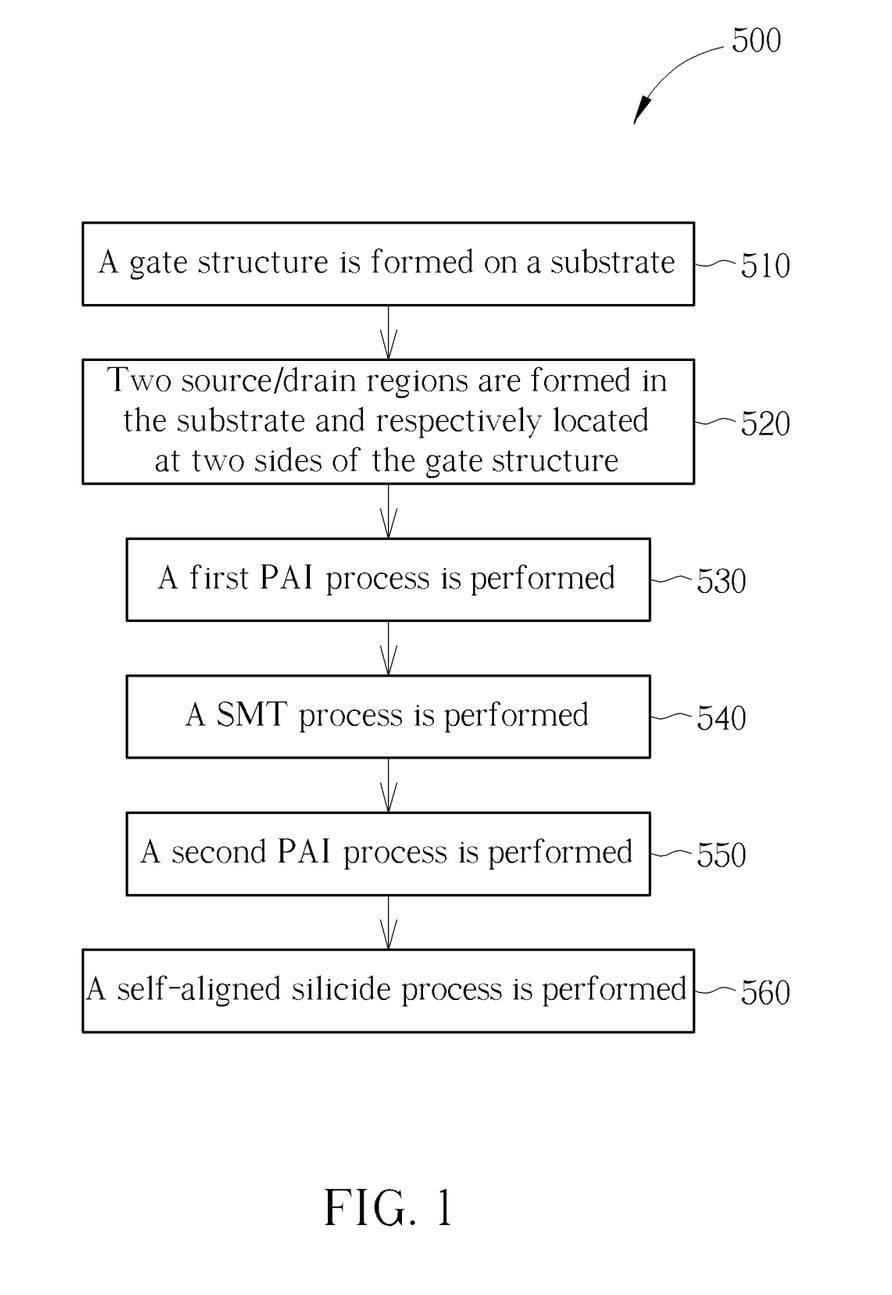
FIG. 1 is a flow diagram showing a method for fabricating an NMOS transistor according to one embodiment of the present disclosure.

Please refer to FIG. 1, which is a flow diagram showing a method 500 for fabricating an NMOS transistor according to one embodiment of the present disclosure. The method 500 for fabricating the NMOS transistor includes Step 510 to Step 560. In Step 510, a gate structure is formed on a substrate. In Step 520, two source/drain regions are formed in the substrate and respectively located at two sides of the gate structure. In Step 530, a first PAI process is performed to implant a first amorphizing substance into the two source/drain regions.

In Step 540, a SMT process is performed to form a strained channel, wherein the strained channel is located in the substrate and below the gate structure, and at least one of the source/drain regions is formed with a dislocation. The SMT process may include Step 541 to Step 543 (not shown). In Step 541, a stress material layer is formed on the gate structure and the two source/drain regions. In Step 542, a first thermal process is performed to form the strained channel. In Step 543, the stress material layer is removed.

In Step 550, a second PAI process is performed to implant a second amorphizing substance into the two source/drain regions, so as to form two amorphous portions respectively in the two source/drain regions. In Step 560, a self-aligned silicide process is performed to form a silicide on the two source/drain regions. The self-aligned silicide process may include Step 561 to Step 564 (not shown). In Step 561, a metal layer is formed on the two source/drain regions. In Step 562, a second thermal process is performed, wherein a portion of the metal layer reacts with silicon in the two source/drain regions to form a silicide precursor. In Step 563, the other portion of the metal layer is removed. In Step 564, a third thermal process is performed, wherein the silicide precursor is converted into the silicide.

Please refer to FIG. 2 to FIG. 8, which are schematic diagrams showing steps for fabricating an NMOS transistor 110 according to one embodiment of the present disclosure, which are exemplary to illustrate the method 500 of FIG. 1. Moreover, in FIG. 2 to FIG. 8, both the NMOS transistor 110 and a PMOS transistor 112 are disposed on a substrate 100, which is exemplary and the present disclosure is not limited thereto. In other embodiment, the substrate 100 may only be disposed with the NMOS transistor 110. Furthermore, other elements (not shown) may be selectively disposed on the substrate 100 or in the substrate 100.

Figure 2:
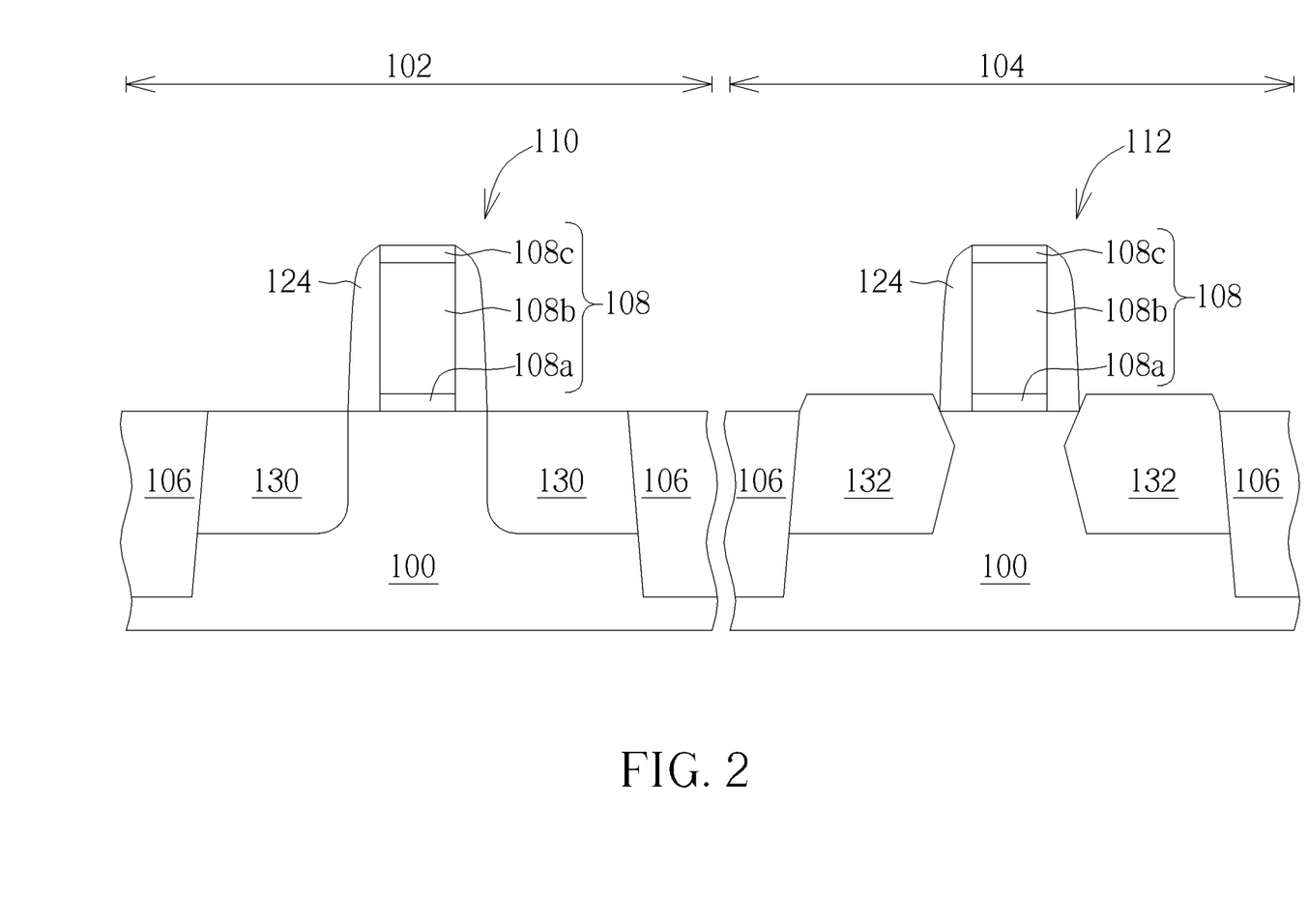
FIG. 2, FIG. 3, FIG. 4, FIG. 5, FIG. 6, FIG. 7 and FIG. 8 are schematic diagrams showing steps for fabricating an NMOS transistor according to one embodiment of the present disclosure.

As shown in FIG. 1 and FIG. 2, Step 510 is performed, in which a gate structure 108 is formed on the substrate 100. In the embodiment, the substrate 100 includes a first region 102 and a second region 104. In the subsequent process, the NMOS transistor 110 is formed in the first region 102 and the PMOS transistor 112 is formed in the second region 104. The substrate 100 may be a semiconductor substrate, such as a silicon substrate, an epitaxial silicon substrate, a silicon carbide substrate, or a silicon on insulator (SOI) substrate.

An insulation structure 106, such as a shallow trench isolation (STI) structure, may be formed in the substrate 100 to provide an electrical isolation function. The material of the insulation structure 106 may be a dielectric material, such as silicon dioxide.

Two gate structures 108 are formed in the first region 102 and the second region 104, respectively. The gate structure 108 includes a gate dielectric layer 108a, a gate material layer 108b and a hard mask 108c from bottom to top. The gate dielectric layer 108a may include silicon dioxide, silicon nitride or a high dielectric constant (high-k) material. The gate material layer 108b may include conductive materials, such as polysilicon, metal material or silicide. The method of fabricating the gate structure 108 may include steps as follows. A gate stack is firstly formed on the substrate 100, wherein the gate stack includes a gate dielectric layer, a gate material layer and a hard mask from bottom to top. Then the gate stack is patterned to obtain the gate structure 108. In the embodiment, the gate structures 108 of the first region 102 and the second region 104 are the same. However, the present disclosure is not limited thereto. The gate structures 108 of the first region 102 and the second region 104 may be different according to practical needs.

Next, a spacer 124 may be formed to surround a sidewall (not labeled) of the gate structure 108. The material of the spacer 124 may include oxides and/or nitrides, such as silicon dioxide, silicon nitride, silicon oxynitride or silicon carbonitride. In addition, light doped drains (LDDs) (not shown) may be formed in the substrate 100, and the LDDs are respectively located at two sides of the gate structure 108 and below the spacer 124.

Step 520 is performed. As shown in FIG. 1 and FIG. 2, two source/drain regions 130 are formed in the substrate 100 and respectively located at two sides of the gate structure 108 in the first region 102, so as to form the NMOS transistor 110 in the first region 102; two source/drain regions 132 are formed in the substrate 100 and respectively located at two sides of the gate structure 108 in the second region 104, so as to form the PMOS transistor 112 in the second region 104.

Specifically, n-type impurities, such as arsenic, phosphorus, etc., may be implanted into the substrate 100 at the two sides of the gate structure 108 in the first region 102 to form the source/drain regions 130. Isotropic etching or anisotropic etching may be performed to the substrate 100 at the two sides of the gate structure 108 in the second region 104 to form two grooves (not shown), and then selective epitaxial growth (SEG) may be performed in the grooves to form an epitaxial layer, such as a silicon germanium epitaxial layer, to provide stress. Then an ion implantation process is performed to implant p-type impurities, such as boron, indium, etc., into the epitaxial layer to form the source/drain regions 132. With the property that the lattice constant of silicon germanium is greater than that of silicon, a strained silicon structure may be formed, which is beneficial to enhance the carrier mobility so as to enhance the operation speed of the PMOS transistor 112.

Figure 3:
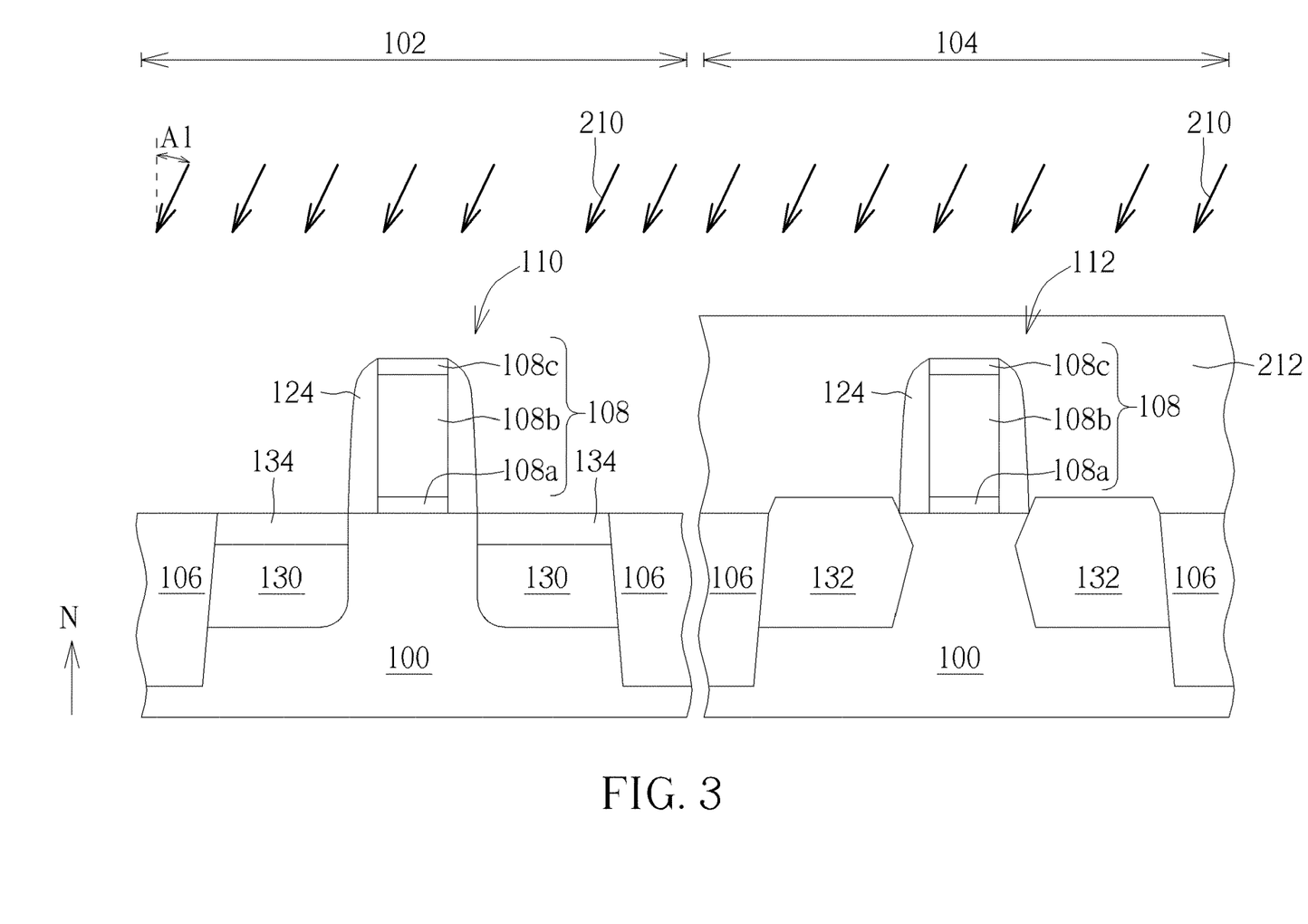

Step 530 is performed. As shown in FIG. 1 and FIG. 3, a first PAI process 210 is performed to implant a first amorphizing substance into the two source/drain regions 130. Specifically, a first mask 212 may be formed on the second regions 104 to prevent the PMOS transistor 112 from being affected by the first PAI process 210. For example, the first amorphizing substance may be prevented from entering into the source/drain regions 132. The first mask 212 may be, but is not limited to, a photoresist. Next, the first PAI process 210 is performed to implant the first amorphizing substance into the two source/drain regions 130 of the NMOS transistor 110 to form the first amorphous portions 134. The first amorphizing substance may include carbon, silicon, germanium, neon, argon, krypton, xenon, radon or a combination thereof. The first amorphizing substance may be implanted into the two source/drain regions 130 with an energy of 5 keV to 25 keV and a dose of 1E14 atoms/cm$^2$ to 1E15 atoms/cm$^2$. The first amorphizing substance may be implanted into the two source/drain regions 130 at a tilt angle A1 of 0 degree to 10 degrees. Specifically, a normal N is defined by the substrate 100. The aforementioned tilt angle A1 refers to an included angle between the direction in which the first amorphizing substance is implanted into the substrate 100 and the normal N. Afterwards, the first mask 212 is removed.

Figure 4:
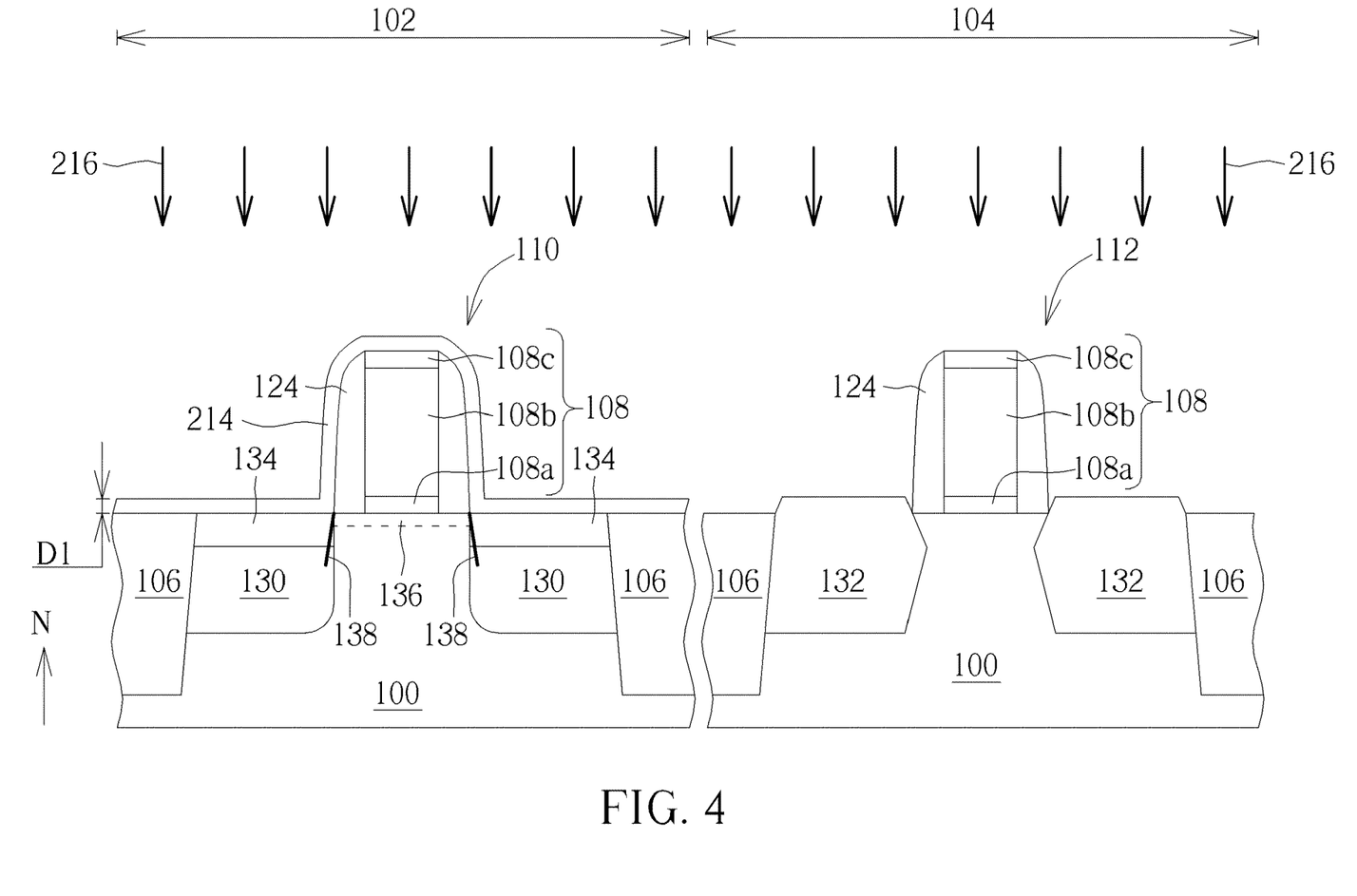

Step 540 is performed. As shown in FIG. 1 and FIG. 4, a SMT process is performed, so as to form a strained channel 136 in the NMOS transistor 110. The strained channel 136 is located in the substrate 100 and below the gate structure 108, and at least one of the source/drain regions 130 is formed with a dislocation 138. Specifically, a stress material layer 214 is formed to cover the first region 102 and the second region 104. Then the portion of the stress material layer 214 covering the second region 104 is removed. As shown in FIG. 4, only the first region 102 is covered by the stress material layer 214. Afterwards, a first thermal process 216, such as a rapid thermal anneal process, is performed. As such, without affecting the PMOS transistor 112, a stress may be provided by the stress material layer 214 to the substrate 100 under the gate structure 108 of the NMOS transistor 110, so as to change the lattice arrangement to form the strain channel 136. Meanwhile, at least one of the two source/drain regions 130 is formed with a dislocation 138 due to the change of the lattice arrangement. Herein, both of the source/drain regions 130 are formed with the dislocations 138, which is only for exemplary. Afterwards, the stress material layer 214 may be removed. For example, the stress material layer 214 may be removed by etching with an etchant. The stress material layer 214 may include nitride, such as silicon nitride, and the etchant may include phosphoric acid. The stress material layer 214 may be formed by chemical vapor deposition (CVD), such as plasma-enhanced chemical vapor deposition (PECVD). A thickness D1 of the stress material layer 214 may be 150 angstroms to 250 angstroms. The first thermal process 216 may be performed at 700° C. to 1100° C. for 100 milliseconds. In the present disclosure, by performing the first PAI process 210 before the SMT process, the structure and/or configuration of the dislocation 138 may be improved, which is beneficial to reduce the probability that the silicide 148 (see FIG. 7) flows along the dislocation 138 to a position/region which is undesired to form the silicide 148 in the subsequent self-aligned silicide process.

Figure 5:
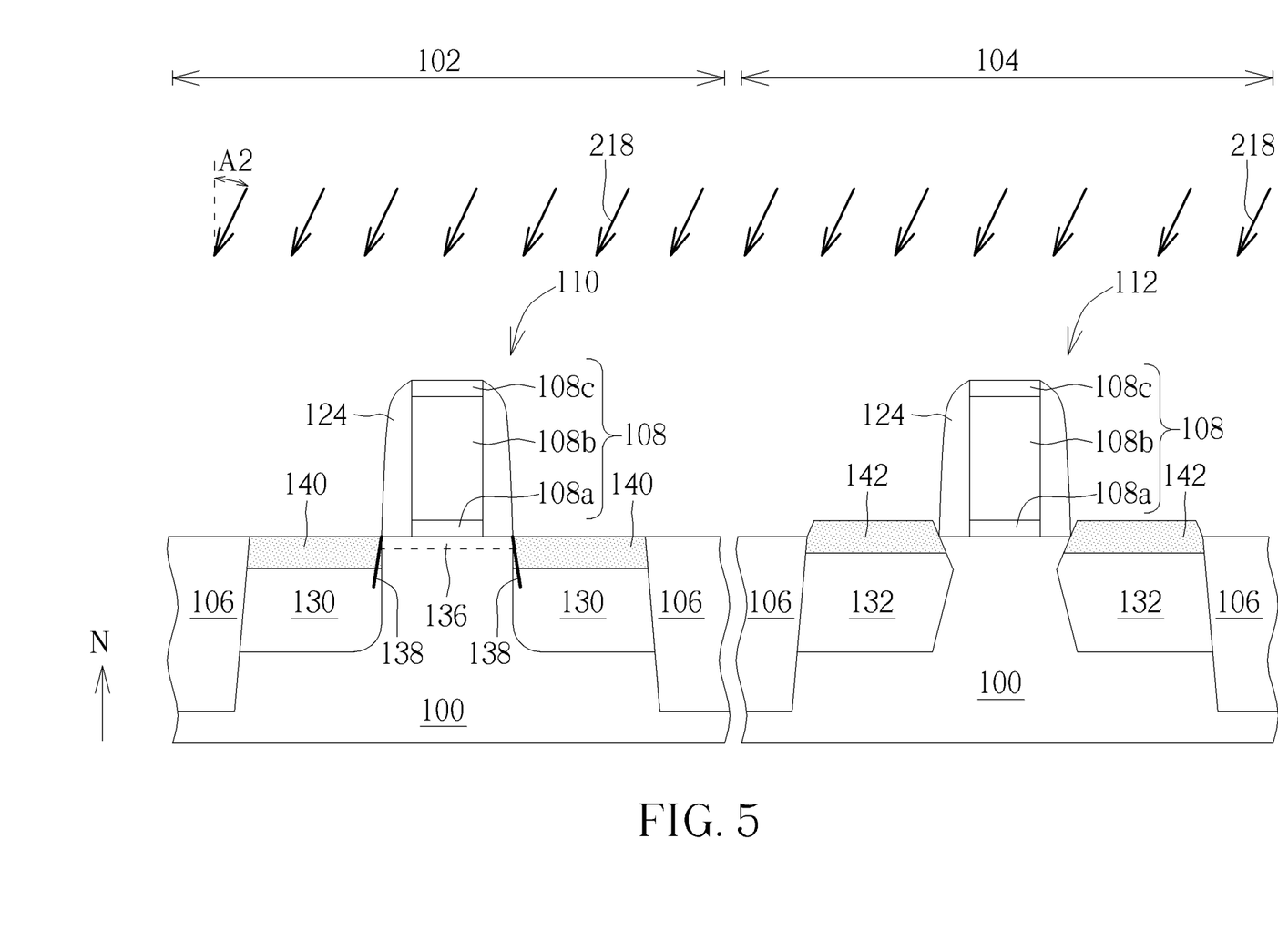

Step 550 is performed. As shown in FIG. 1 and FIG. 5, a second PAI process 218 is performed to implant a second amorphizing substance into the source/drain regions 130 and the source/drain regions 132, so as to form two second amorphous portions 140 respectively in the two source/drain regions 130 and two third amorphous portions 142 respectively in the two source/drain regions 132. The second amorphizing substance may include carbon, silicon, germanium, neon, argon, krypton, xenon, radon or a combination thereof. The second amorphizing substance may be implanted into the source/drain regions 130 and the source/drain regions 132 with an energy of 1 keV to 20 keV and a dose of 1E14 atoms/cm$^2$ to 1E15 atoms/cm$^2$. The second amorphizing substance may be implanted into the source/drain regions 130 and the source/drain regions 132 at a tilt angle A2 of 0 degree to 10 degrees. The definition of the tilt angle A2 may refer to the definition of the tilt angle A1, and is omitted herein.

Figure 6:
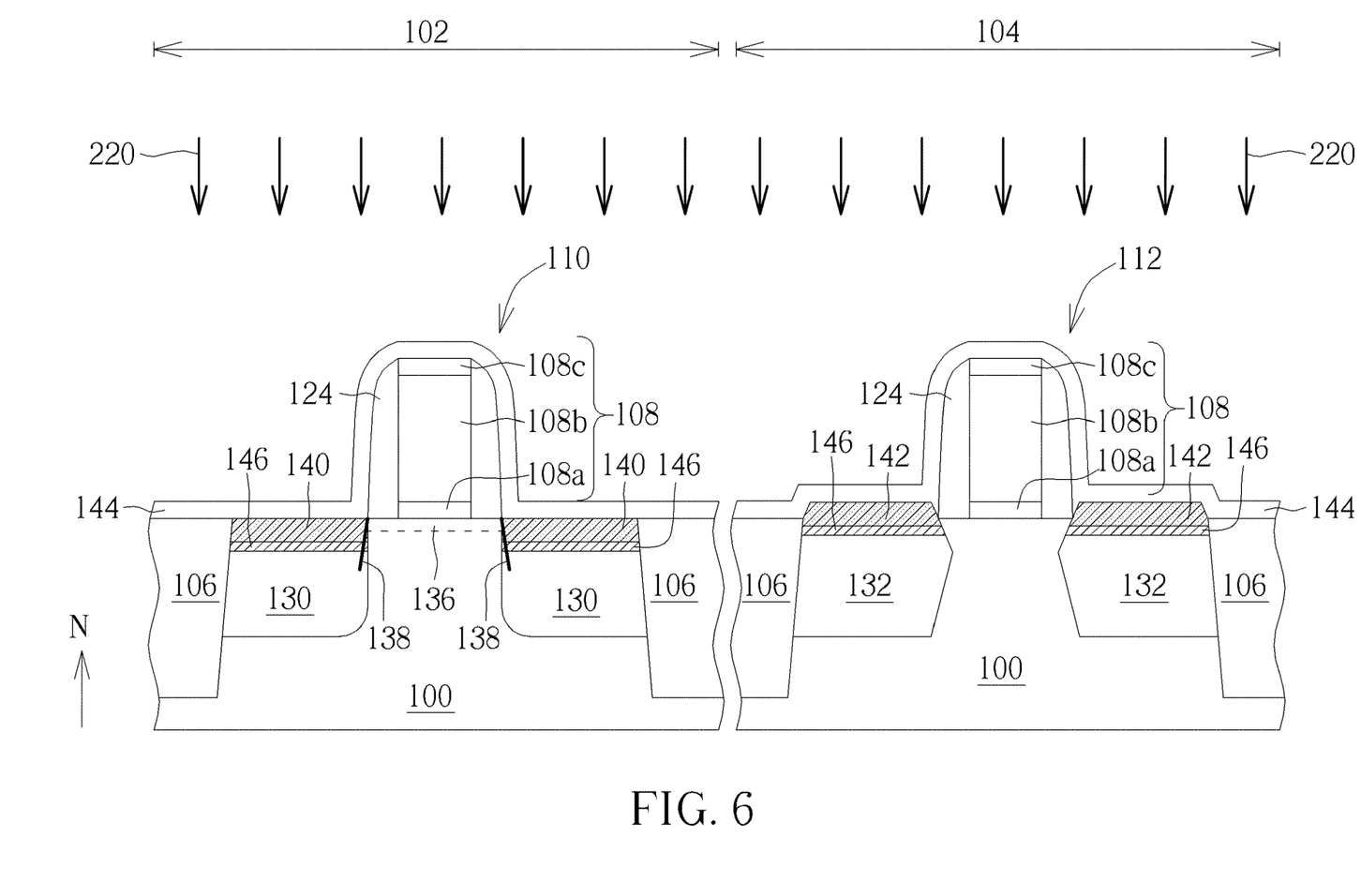
Figure 7:
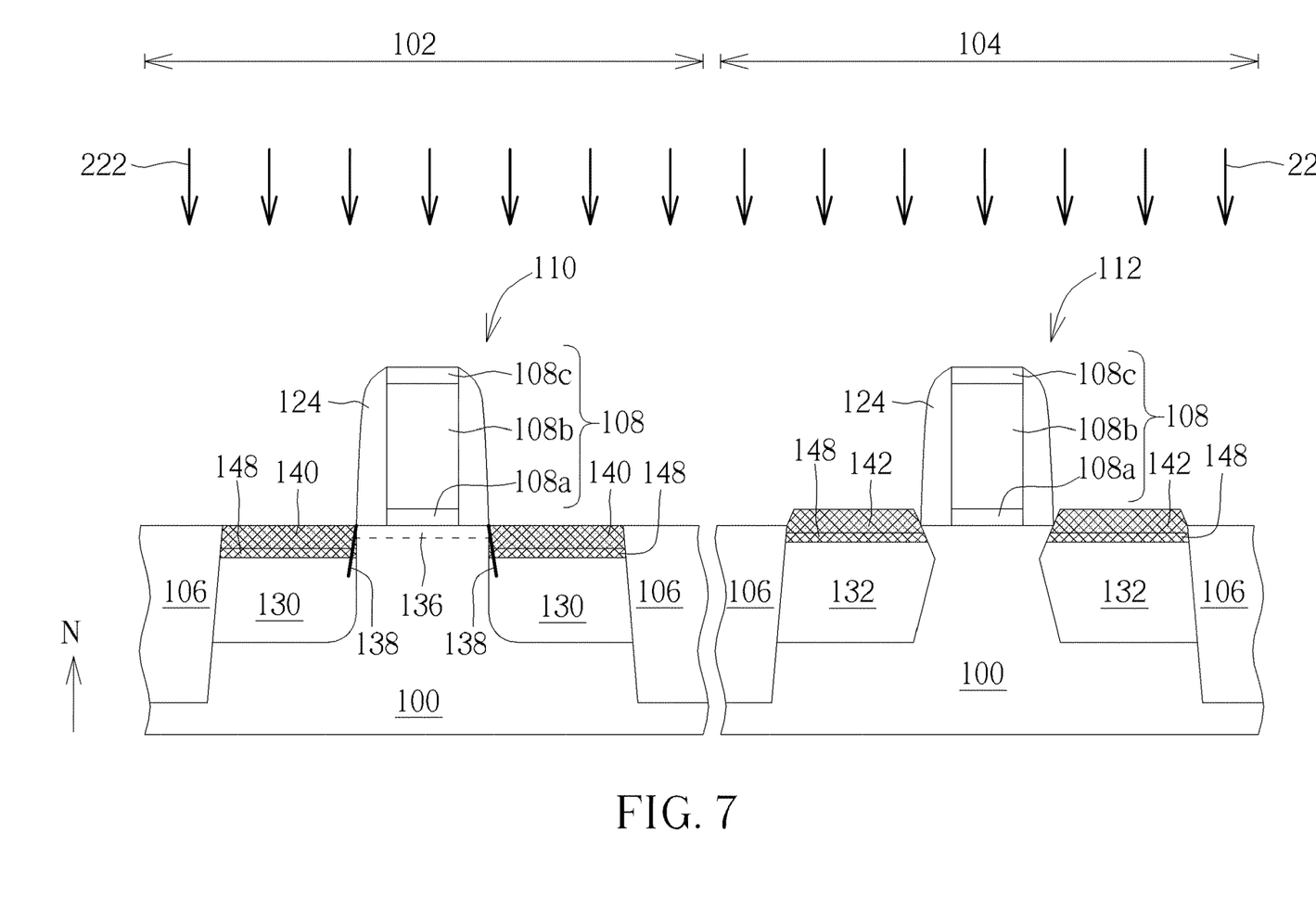

Step 560 is performed. As shown in FIG. 1, FIG. 6 and FIG. 7, a self-aligned silicide process is performed. First, as shown in FIG. 6, a metal layer 144 is formed to cover the first region 102 and the second region 104. Specifically, the metal layer 144 is formed on the source/drain regions 130 and the source/drain regions 132. The metal layer 144 may include nickel (Ni), titanium (Ti), cobalt (Co), tungsten (W), molybdenum (Mo), platinum (Pt), palladium (Pd) or a combination thereof. Next, a second thermal process 220 is performed, wherein a portion of the metal layer 144 reacts with silicon in the source/drain regions 130 and the source/drain regions 132 to form a silicide precursor 146. Herein, a depth of the silicide precursor 146 in the source/drain regions 130 is deeper than that of the second amorphous portions 140. That is, in each of the source/drain regions 130, a space occupied by the silicide precursor 146 covers a space occupied by the second amorphous portion 140, and a portion of the silicide precursor 146 overlaps the second amorphous portion 140. As shown in FIG. 7, the other portion of the metal layer 144, i.e., the portion of the metal layer 144 that does not react with silicon, is removed. Then a third thermal process 222 is performed to convert the silicide precursor 146 into the silicide 148. The third thermal process 222 may be a millisecond annealing process. The third thermal process 222 may be performed at 810° C. to 880° C. for 100 milliseconds. For example, when the metal layer 144 includes nickel, the silicide precursor 146 may include Ni$_2$Si, and the silicide 148 may include NiSi. That is, with the third thermal process 222, the Ni$_2$Si which is less stable and has a higher resistance may be converted into the NiSi which is more stable and has a lower resistance. In addition, according to different circuit designs, a salicide blocking (SAB) layer (not shown) may be formed on partial regions of the first region 102 and the second region 104 which are undesired to form the silicide 148, so as to prevent the partial regions from forming the silicide 148 in the self-aligned silicide process. How to form the SAB layer is well known to those skilled in the art and is omitted herein. In the present disclosure, the second PAI process 218 is performed before the self-aligned silicide process, which is beneficial to control the distribution of the silicide 148, so as to prevent the silicide 148 from being formed in the undesired position/region. Furthermore, in the present disclosure, with the parameters of the second PAI process 218 falling within the aforementioned range, it is beneficial for forming the silicide precursor 146/silicide 148 with a deeper depth (larger thickness), and can reduce the probability that the silicide 148 flows along the dislocation 138 to an undesired position/region (i.e., the position/region where the silicide 148 is not intended to be formed). Furthermore, in the present disclosure, with the parameters of the third thermal process 222 falling within the aforementioned range, it is beneficial to convert the silicide precursor 146 which is less stable and has a higher resistance into the silicide 148 which is more stable and has a lower resistance.

Figure 8:
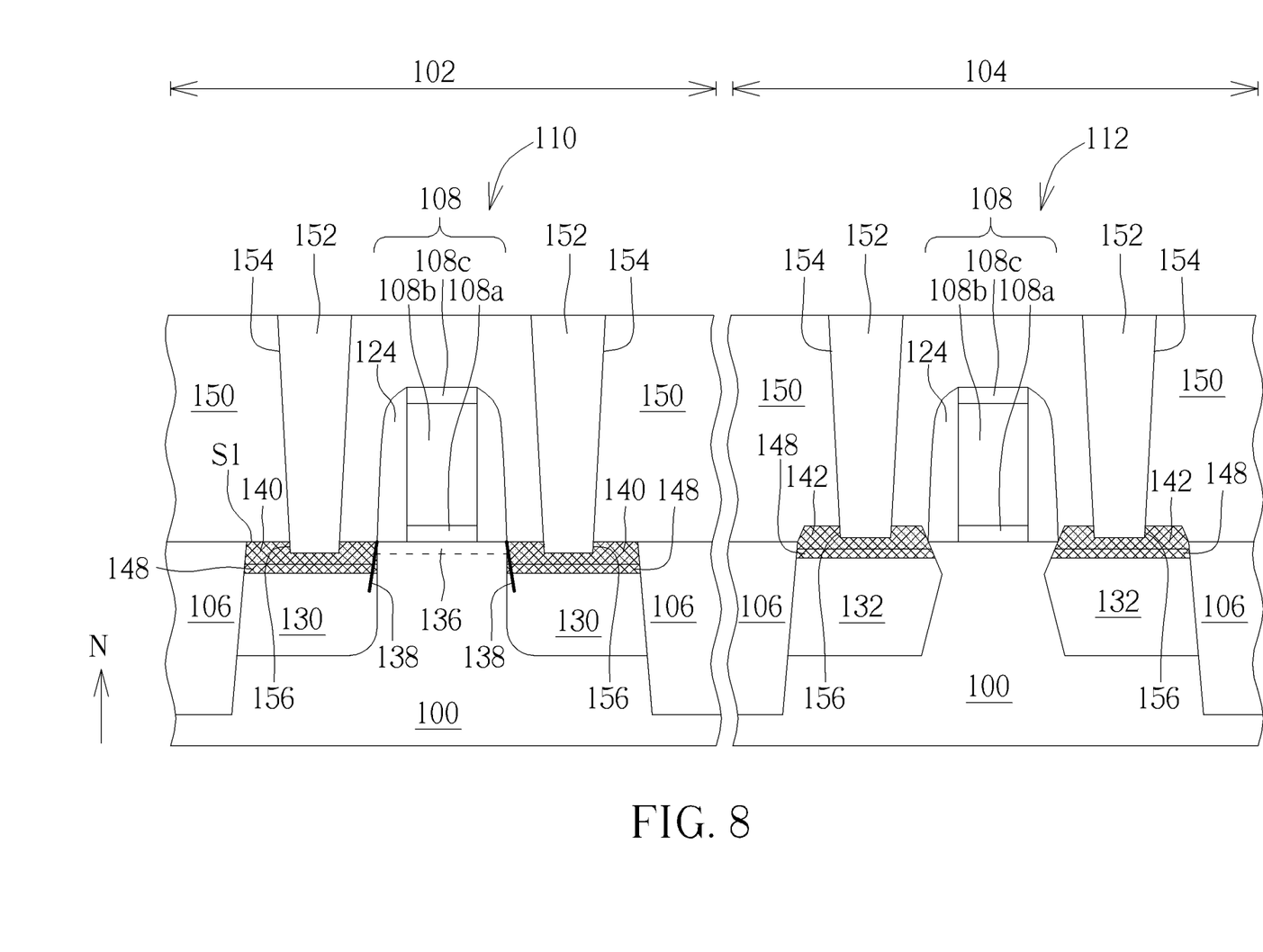

Afterwards, as shown in FIG. 8, a process of fabricating the contact plug 152 may be performed. First, a contact etch stop layer (not shown) is formed to cover the first region 102 and the second region 104. The material of the contact etch stop layer may include silicon nitride. Next, a dielectric layer 150 is formed to cover the contact etch stop layer. The material of the dielectric layer 150 may include tetraethoxysilane (TEOS). Then at least one contact plug 152 is formed in the dielectric layer 150, wherein the at least one contact plug 152 is connected to the silicide 148. Specifically, at least one contact hole 154 may be formed in the dielectric layer 150. The contact hole 154 penetrates the dielectric layer 150 and the contact etch stop layer. A barrier layer (not shown) and a metal layer (not shown) may be sequentially deposited in the contact hole 154. The barrier layer may include titanium nitride, tantalum nitride, tungsten nitride or a combination thereof. The metal layer may include aluminum, titanium, tantalum, tungsten, niobium, molybdenum, copper or a combination thereof. Then a planarization process, such as a chemical mechanical polishing process, is performed, such that top surfaces of the barrier layer and the metal layer are aligned with a top surface of the dielectric layer 150 to form the contact plug 152, and the fabrication of the NMOS transistor 110 and the PMOS transistor 112 are completed. After the contact plug 152 is formed, a top surface S1 of the silicide 148 may be recessed to form a recess 156.

Figure 9:
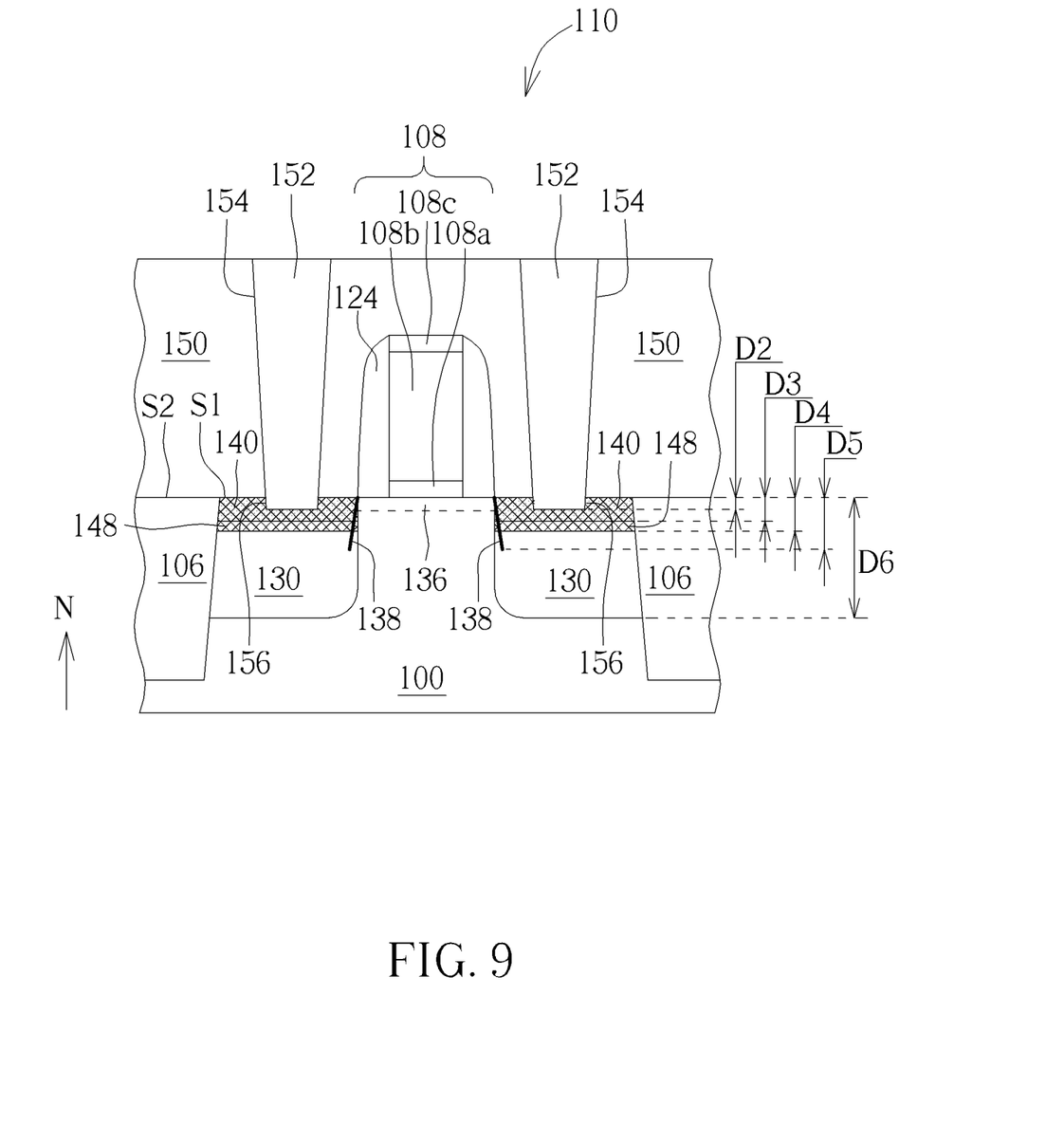
FIG. 9 is a schematic cross-sectional view of an NMOS transistor according to one embodiment of the present disclosure.

Please refer to FIG. 9, which is a schematic cross-sectional view of an NMOS transistor 110 according to one embodiment of the present disclosure. The NMOS transistor 110 includes a gate structure 108, two source/drain regions 130, two amorphous portions (herein, the second amorphous portions 140) and a silicide 148. The gate structure 108 is disposed on a substrate 100. The two source/drain regions 130 are disposed in the substrate 100 and respectively located at two sides of the gate structure 108, wherein at least one of the source/drain regions 130 is formed with a dislocation 138. Herein, both of the source/drain regions 130 are formed with the dislocations 138, which is only for exemplary. The two second amorphous portions 140 are respectively disposed in the two source/drain regions 130. The silicide 148 is disposed on the two source/drain regions 130, wherein at least one portion of the silicide 148 overlaps the two second amorphous portions 140. Herein, the top surface S1 of the silicide 148 is aligned with a top surface S2 of the substrate 100. However, the present disclosure is not limited thereto. In other embodiment, the top surface S1 of the silicide 148 may be slightly higher or slightly lower than the top surface S2 of the substrate 100. The top surface S1 of the silicide 148 may be formed with a recess 156 having a depth D2, and the depth D2 of the recess 156 may be 50 angstroms to 100 angstroms. Each of the second amorphous portions 140 has a depth D3, and the depth D3 of each of the second amorphous portions 140 may be 50 angstroms to 100 angstroms. The silicide 148 has a depth D4, and the depth D4 of the silicide 148 may be 120 angstroms to 200 angstroms. The dislocation 138 has a depth D5, and the depth D5 of the dislocation 138 may be 150 angstroms to 250 angstroms. Each of the source/drain regions 130 has a depth D6, and the depth D6 of the source/drain regions 130 may be 400 angstroms to 600 angstroms. The two second amorphous portions 140 are implanted with a second amorphizing substance, and the second amorphizing substance may include carbon, silicon, germanium, neon, argon, krypton, xenon, radon or a combination thereof. The silicide 148 may include a silicide of nickel, titanium, cobalt, tungsten, molybdenum, platinum, palladium or a combination thereof. The NMOS transistor 110 may be fabricated by the aforementioned method 500. With the method 500 including the first PAI process, the SMT process, the second PAT process and the self-aligned silicide process simultaneously, it is beneficial to reduce the probability that the silicide 148 flows along the dislocation. Furthermore, with the cooperation of the parameters of the aforementioned processes, it is beneficial for the dimensions of the elements of the NMOS transistor 110, such as D2 to D6, falling within specific ranges, such that the NMOS transistor 110 can be featured with improved property and yield. For other details of the NMOS transistor 110, reference may be made to the above description and are omitted herein.

Figure 10:
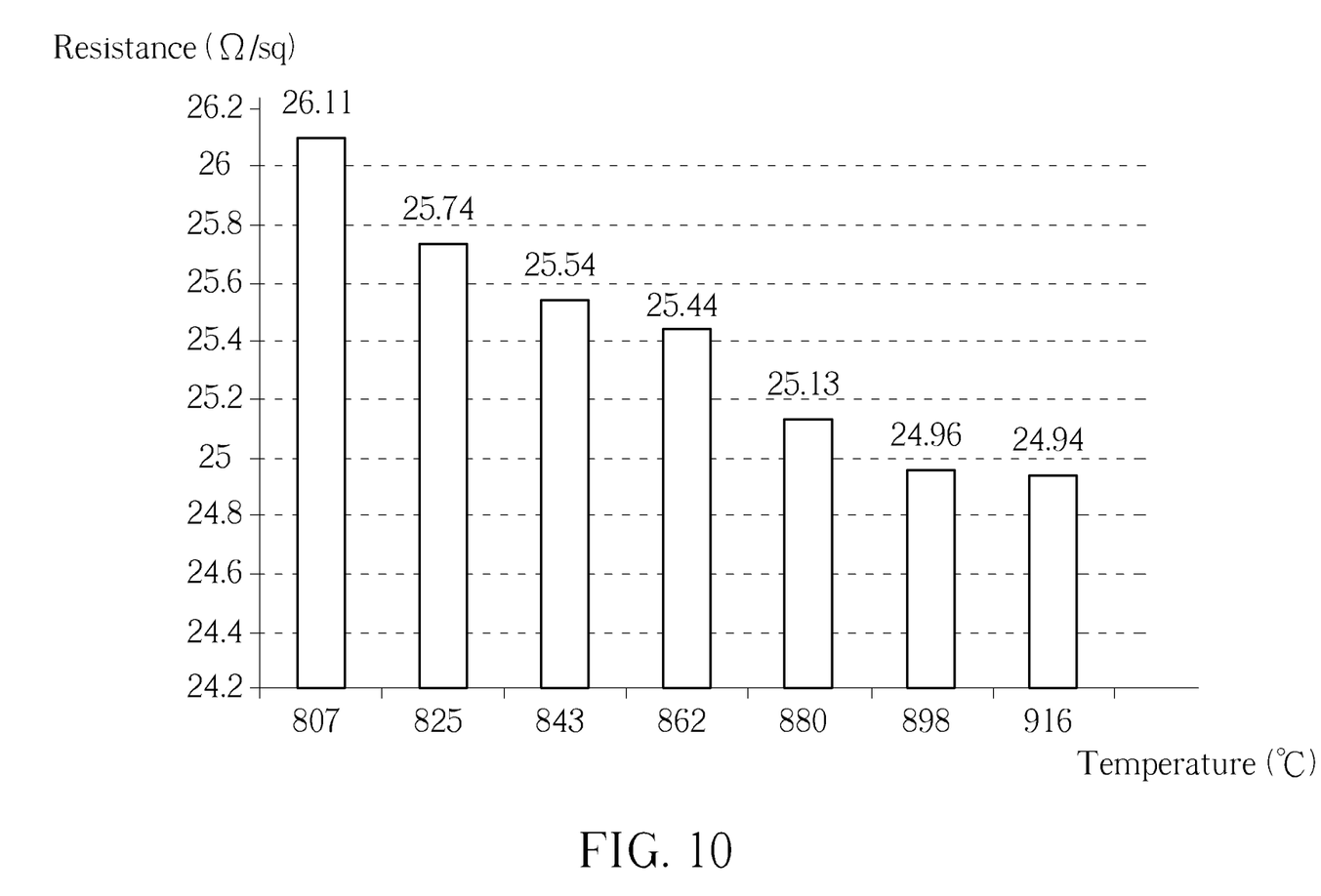
FIG. 10 shows a relationship between resistances of NMOS transistors and temperatures of a third thermal process.

Please refer to FIG. 10, which shows a relationship between resistances (RSs) of NMOS transistors and temperatures of a third thermal process. As shown in FIG. 10, in the temperature range of 807° C. to 916° C., when the time of the third thermal process is the same, herein, the time is 100 milliseconds, the resistance of the NMOS transistor can be reduced by increasing the temperature of the third thermal process. When the temperature of the third thermal process is increased to a certain degree, for example, in the range of 898° C. to 916° C., the reducing degree of the resistance becomes slow. Therefore, the third thermal process of the present disclosure may preferably be performed at 810° C. to 880° C. for 100 milliseconds, which is beneficial to reduce the resistance and can avoid unnecessary energy waste caused by excessively high temperature.

Compared with the prior art, the method for fabricating the NMOS transistor according to present disclosure includes the first PAI process, the SMT process, the second PAT process and the self-aligned silicide process simultaneously, which is beneficial to reduce the probability that the silicide flows along the dislocation, such that the NMOS transistor can be featured with improved property and yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An n-type metal oxide semiconductor (NMOS) transistor, comprising:
   a gate structure disposed on a substrate;
   two source/drain regions disposed in the substrate and respectively located at two sides of the gate structure, wherein at least one of the source/drain regions is formed with a dislocation;
   two amorphous portions respectively disposed in the two source/drain regions; and
   a silicide disposed on the two source/drain regions, wherein at least one portion of the silicide overlaps the two amorphous portions, a bottom of the silicide is lower than a bottom of each of the two amorphous portions, at least a portion of the dislocation is located in the silicide, and a depth of the dislocation in the substrate is deeper than a depth of the silicide in the substrate.

2. The NMOS transistor of claim 1, wherein the depth of the dislocation in the substrate is 150 angstroms to 250 angstroms.

3. The NMOS transistor of claim 1, wherein the depth of the silicide in the substrate is 120 angstroms to 200 angstroms.

4. The NMOS transistor of claim 1, wherein a top surface of the silicide is formed with a recess, and a depth of the recess is 50 angstroms to 100 angstroms.

5. The NMOS transistor of claim 1, wherein a depth of each of the amorphous portions is 50 angstroms to 100 angstroms.

6. The NMOS transistor of claim 1, wherein a depth of each of the source/drain regions is 400 angstroms to 600 angstroms.

7. The NMOS transistor of claim 1, wherein the two amorphous portions are implanted with an amorphizing substance, and the amorphizing substance comprises carbon, silicon, germanium, neon, argon, krypton, xenon, radon or a combination thereof.

8. The NMOS transistor of claim 1, wherein the silicide comprises a silicide of nickel, titanium, cobalt, tungsten, molybdenum, platinum, palladium or a combination thereof.

* * * * *